(12) United States Patent
Iwasaki et al.

(10) Patent No.: US 6,271,559 B1
(45) Date of Patent: *Aug. 7, 2001

(54) SEMICONDUCTOR MEMORY WITH INFORMATION STORAGE CAPACITANCE INCLUDING AN ELECTRODE CONTAINING PRECIOUS METAL AND AN ADDED ELEMENT

(75) Inventors: Tomio Iwasaki, Tsukuba; Hideo Miura, Koshigaya, both of (JP)

(73) Assignee: Hitachi, LTD, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,632

(22) Filed: Nov. 4, 1998

(30) Foreign Application Priority Data

Nov. 4, 1997 (JP) ................................................ 9-301985

(51) Int. Cl.[7] ............................ H01L 29/76; H01L 29/94; H01L 31/062; H01L 31/113; H01L 31/119
(52) U.S. Cl. .......................... 257/310; 257/295; 257/296; 257/309
(58) Field of Search .................................... 257/295, 296, 257/783, 309, 310

(56) References Cited

U.S. PATENT DOCUMENTS

| | | | |
|---|---|---|---|
| 5,471,363 | * 11/1995 | Mihara | 365/305 |
| 5,471,364 | * 11/1995 | Summerfelt et al. | 361/321.4 |
| 5,612,574 | * 3/1997 | Summerfelt et al. | 257/783 |
| 5,708,284 | * 1/1998 | Onishi | 257/295 |
| 6,020,233 | * 2/2000 | Kim | 438/240 |

FOREIGN PATENT DOCUMENTS 3-256358   11/1991   (JP) .

* cited by examiner

*Primary Examiner*—Eddie Lee
*Assistant Examiner*—Jesse A. Fenty
(74) *Attorney, Agent, or Firm*—Antonelli, Terry, Stout & Kraus, LLP

(57) ABSTRACT

A semiconductor memory includes a structure in which an insulating film is formed on a transistor constituted by a gate oxide film, a gate electrode and diffusion regions, an information storage capacitance device is formed on the insulating film and is connected to the diffusion layer through a polycrystalline silicon film. The capacitance device includes a bottom electrode formed by laminating an electrically conductive film and a precious metal film, an oxide film and a top electrode. The precious metal film contains an additional element having a smaller atomic radius than that of a precious metal element as a main constituent element besides the precious metal element, and interatomic bond energy between this additional element and the precious metal element is within ±20 % of interatomic bond energy between the precious metal elements. This structure can restrict the grain boundary diffusion of oxygen in the precious metal film as well as oxidation of the electrically conductive film, can prevent delamination between the conductive film and the precious metal film, and can prevent conduction failures.

15 Claims, 4 Drawing Sheets

SEMICONDUCTOR MEMORY WITH INFORMATION STORAGE CAPACITANCE INCLUDING AN ELECTRODE CONTAINING PRECIOUS METAL AND AN ADDED ELEMENT

BACKGROUND OF THE INVENTION

This invention relates to a semiconductor memory, more particularly, to a semiconductor memory having an information storage capacitance device comprising at least a precious metal electrode film and a ferroelectric film or an oxide film having a high dielectric constant.

The area of the information storage capacitance device has become smaller and smaller in recent years with miniaturization of semiconductor devices and the absolute value of a capacitance also tends to decrease. The capacitance C is determined by the following equation (1) in the case of a parallel flat sheet electrode structure, for example:

$$C = \epsilon \cdot S/d \quad (1)$$

where $\epsilon$ is a dielectric constant of dielectrics, S is the area of an electrode and d is a film thickness of the dielectrics (distance between electrodes).

To secure the capacitance without increasing the area S of the electrodes used for the information storage capacitance device, it is necessary either to use dielectrics having a high dielectric constant $\epsilon$ or to reduce the film thickness d of the dielectrics.

Because an inherent limit exists to the reduction of the film thickness of the dielectrics, however, technology of securing the capacitance without increasing the planar area of an insulating film used for the information storage capacitance device has been proposed as typified by a semiconductor memory using a ferroelectric such as PZT (Pb($Zr_x Ti_{1-x}$)$O_3$), etc, as the dielectrics that is described in JP-A-3-256358.

Since these ferroelectric materials are oxides and film formation is conducted under condition at a temperature of hundreds of Centigrades (° C.), single-crystal silicon for fabricating a transistor, for example, cannot be used as a capacitance electrode. This is because the oxidation-reduction reaction takes place in the interface between silicon and the ferroelectric material during the film formation process or in subsequent process steps, thereby film quality of the ferroelectric film is very likely to get deteriorated.

Therefore, those materials which are difficultly oxidized even at high temperature must be used for the electrode of the ferroelectric material. The materials such as PZT have ferroelectricity only when their crystal structure is a perovskite structure. It is known empirically that crystallinity of the thin films in general having the perovskite structure is greatly affected by an underlay material.

In other words, because the material of the bottom electrode must have a function such that the perovskite thin film can grow epitaxially with the (111) or (001) texture, the lower electrode material is limited from the aspect of the crystal structure.

With the background described above, precious metal materials having a face-centered cubic structure such as platinum have been examined as the bottom electrode material. However, when a precious metal electrode is used for semiconductors, an electrically conductive film such as TiN (titanium nitride) or Ti (titanium) is necessary as a barrier layer for preventing silicon diffusion in order to prevent a silicidation reaction (chemical reaction between silicon and other metals).

SUMMARY OF THE INVENTION

A high temperature of not lower than about 500° C. is necessary for forming the PZT thin film having the perovskite structure.

However, conduction failures have often occurred in the past in the information storage capacitance device structures whose ferroelectric thin film such as PZT is formed at a temperature higher than about 500° C.

Because the related technology has not clarified the cause for the occurrence of the conduction failures, effective measures have not yet been established to solve the conduction failures.

It is an object of the present invention to accomplish a semiconductor memory which restricts the occurrence of conduction failure in an information storage capacitance device using a ferroelectric film or an oxide film having a high dielectric constant as dielectrics, and which operates stably.

(1) To accomplish this object, the semiconductor memory according to the present invention employs the following structure. A semiconductor memory having a structure in which an information storage capacitance device comprising a ferroelectric film or an oxide film having a high dielectric constant formed on a bottom electrode including at least one layer of a precious metal layer in such a manner as to keep contact with the bottom electrode and a top electrode formed on the ferroelectric film or on the oxide film is electrically connected to a silicon (Si) substrate either directly or through an electrically conductive film, wherein the precious metal layer contains at least one kind of additional elements, at least one kind of the additional elements is an element having a smaller atomic radius than the atomic radius of the precious metal element, and interatomic bond energy between this element and the precious metal element is within ±20% of interatomic bond energy between the precious metal elements.

(2) Preferably, in the item (1) described above, the precious metal layer comprises platinum (Pt) containing at least element selected from the group consisting of nickel (Ni), cobalt (Co), vanadium (V), iron (Fe) and chromium (Cr).

(3) Preferably, in the item (1) described above, the precious metal layer comprises gold (Au) containing at least one element selected from the group consisting of copper (Cu), palladium (Pd), chromium (Cr), iron (Fe), cobalt (Co) and nickel (Ni).

(4) Preferably, in the item (1) described above, the precious metal layer comprises silver (Ag) containing at least one element selected from the group consisting of copper (Cu), palladium (Pd), chromium (Cr) and gold (Au).

(5) Preferably, further, in the item (1) described above, the concentration of the additional element to the precious metal element is from 0.05 to 50 at %.

The inventors of the present invention have clarified for, the first time, the cause for the occurrence of conduction defects in the information storage capacitance device.

In other words, the present inventors have found out that when an oxide thin film is formed at high temperature of not lower than about 500° C. the oxygen atoms diffuse through the crystal grain boundary of the precious metal film, so that the electrically conductive film as a barrier layer between the precious metal film and the Si substrate is oxidized and delamination occurs between the conductive film and the precious metal film to thereby invite the conduction defects.

It can be appreciated from this finding that in order to prevent the conduction defect, the grain boundary diffusion of the oxygen atoms in the precious metal film must be restricted.

Therefore, the present inventors have clarified that when the additional elements are contained in the precious metal film, at least one kind of these additional elements is the one that has a smaller atomic radius than that of the main constituent element of the precious metal film, and when interatomic bond energy between this element and the main constituent element is within ±20% of interatomic bond energy between the main constituent elements, the grain boundary diffusion in the precious metal film can be restricted.

Incidentally, the term "main constituent element" of the precious metal film hereby means an element that is contained in the greatest amount in the precious metal film.

DESCRIPTION OF THE PREFERRED EMBODIMENTS

Hereinafter, preferred embodiments of the present invention will be explained with reference to the accompanying drawings.

Figure 1:
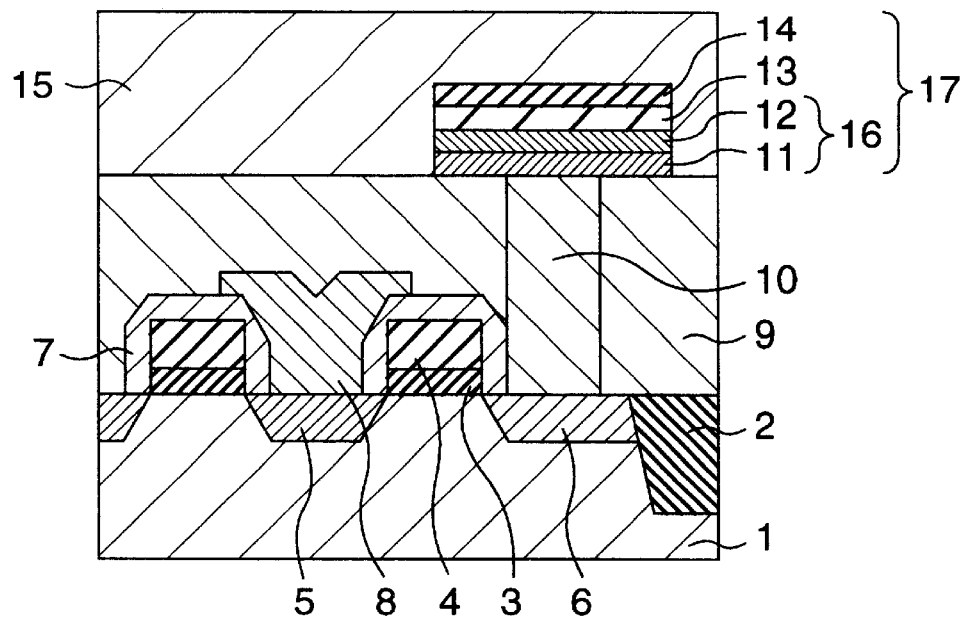
FIG. 1 is a sectional view showing the main portion of a semiconductor memory according to the first embodiment of the present invention.

Initially, FIG. 1 shows a sectional structure of the main portions of a semiconductor memory according to the first embodiment of the present invention.

The semiconductor memory of the first embodiment comprises a MOS (Metal Oxide Semiconductor) type transistor formed in an active area of a main plane of a silicon substrate 1 and one information storage capacitance device 17 disposed on the MOS transistor as shown in FIG. 1. Each MOS transistor is separated by a device isolation film 2.

The MOS transistor constituting the memory cell comprises a gate oxide film 3, a gate electrode 4 and a pair of diffusion layers 5 and 6 (source and drain regions). The gate oxide film 3 comprises a silicon oxide film, a silicon nitride film, a ferroelectric film or their laminate structure, for example.

The gate electrode 4 comprises a polysilicon film, a metal thin film, a metal silicide film or their laminate structure, for example. A silicon oxide film 7 is formed on the gate electrode 4 and on the side walls of this gate electrode 4. A bit line 8 is connected to one of the diffusion regions 5 of the memory cell selection MOS transistor. An insulating film 9 comprising a BPSG (Boro-doped Phospho Silicate Glass) film, a SOG (Spin On Glass) film, a silicon oxide film or a nitride film formed by chemical vapor deposition or sputtering, is formed on the whole upper surface of the MOS transistor.

The information storage capacitance device 17 is formed on the insulating film 9 that covers the MOS transistor, and is connected to the other diffusion region 6 of the memory cell selection MOS transistor through a polycrystalline silicon film 10. The information storage capacitance device 17 has a laminate structure comprising a laminate film of an electrically conductive film 11 such as a TiN (titanium nitride) film, a Ti (titanium) film, etc, and a precious metal film 12, an oxide film 13 comprising a ferroelectric film or an oxide film 13 made of an oxide having a high dielectric constant, and a top electrode 14 that are serially laminated from below in order named. The information storage capacitance device 17 is covered with an insulating film 15.

Here, the precious metal film 12 contains at least one kind of additional elements besides the precious metal element as the main constituent element, at least one of these additional elements is the one that has a smaller atomic radius than that of the precious metal element and furthermore, interatomic bond energy between this additional element and the precious metal element is within ±20% of interatomic bond energy between the precious metal elements.

More specifically, when platinum is used as the main constituent element of the precious metal film 12, at least one of the additional elements selected from the group consisting of nickel, cobalt, vanadium and chromium may be contained.

When gold is used as the main constituent element of the precious metal film 12, at least one of the additional elements selected from the group consisting of copper, palladium, chromium, iron, cobalt and nickel may be contained.

When silver is used as the main constituent element of the precious metal film 12, further, at least one of the additional elements selected from the group consisting of copper, palladium, chromium and gold may be contained.

Such a precious metal film 12 is formed by two-element sputtering by using a target made of the main constituent element and a target made of the additional element.

Next, the effects of the semiconductor memory according to the first embodiment of the present invention will be explained.

It has been clarified by experiments that in conventional semiconductor memories, the electrically conductive film 11 is oxidized and delamination develops between this conductive film 11 and the precious metal film 12 during the temperature raising process to around or higher than 500° C. in order to form the ferroelectric film or the oxide film 13 made of the oxide having a high dielectric constant.

Because this oxidation of the electrically conductive film 11 is induced by the diffusion of oxygen along the grain boundary of the precious metal film 12, the oxidation can be prevented by restricting the grain boundary diffusion.

Therefore, the effect of the additional element manifests itself in the decrease ratio of the grain boundary diffusion coefficient when the additional element is contained in the precious metal film 12.

The grain boundary diffusion coefficient D is calculated by computer simulation by using each of platinum, gold and silver as the main constituent element of the precious metal film 12 and the effects of the additional elements are represented by taking the atomic radius of each additional element and its bound energy into specific account. The results are shown in FIGS. 2, 3 and 4, respectively.

Figure 2:
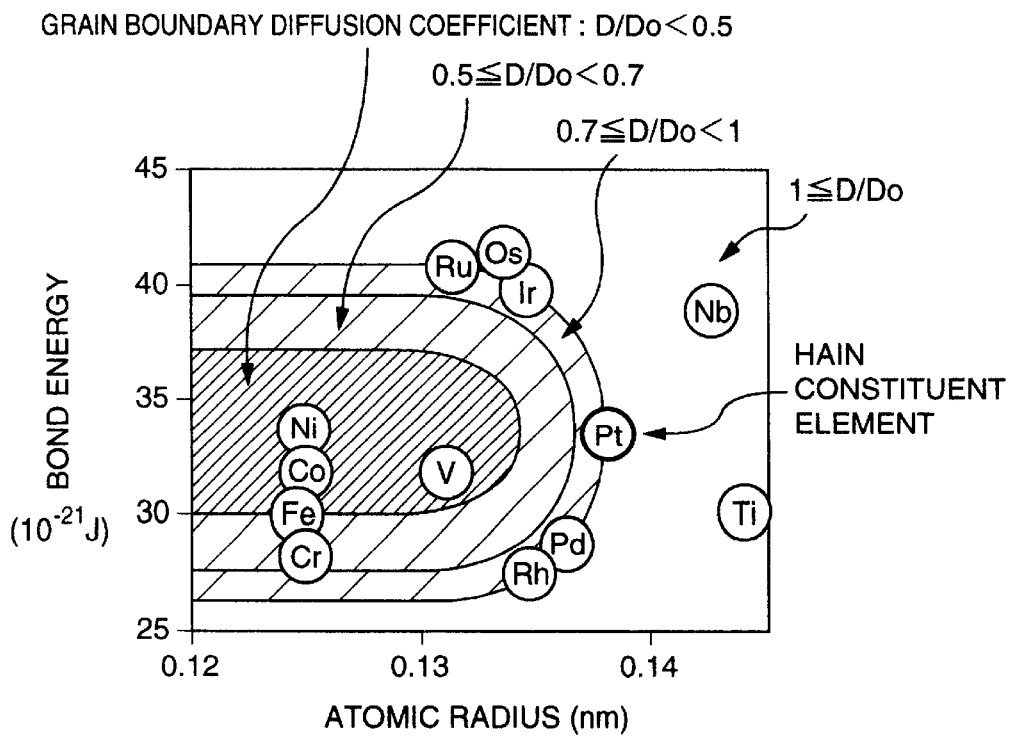
FIG. 2 is a schematic view useful for explaining the effect of additional elements on a grain boundary diffusion coefficient of a film using platinum as a main constituent element.
Figure 3:
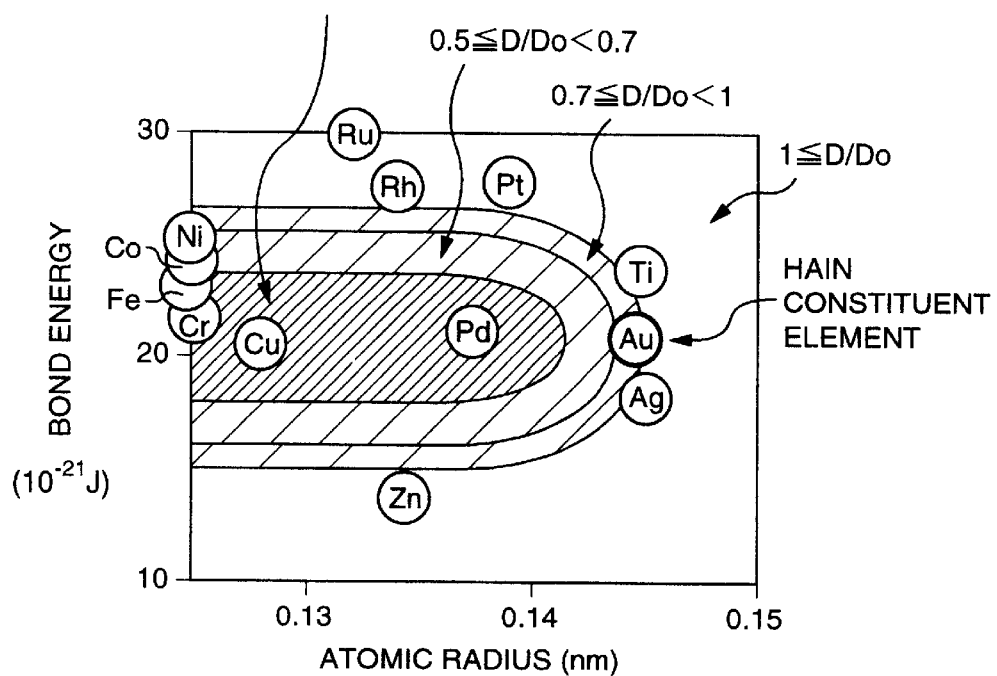
FIG. 3 is a schematic view useful for explaining the effect of additional elements on a grain boundary diffusion coefficient of a film using gold as a main constituent element.
Figure 4:
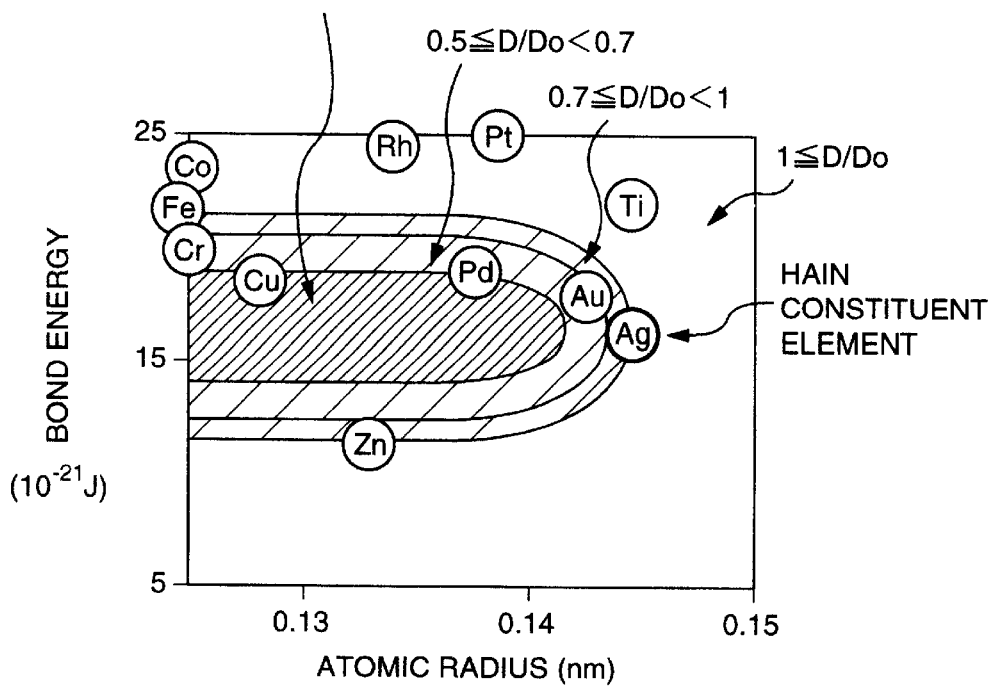
FIG. 4 is a schematic view useful for explaining the effect of additional elements on a grain boundary diffusion coefficient of a film using silver as a main constituent element.

In each of FIGS. 2 to 4, the grain boundary diffusion coefficient D is calculated by adding 0.2 at % of the additional element at 600° C. and Do represents the grain boundary diffusion coefficient when no additional element is contained.

It has been found out from these drawings that the grain boundary diffusion coefficient D can be limited to a small value when the additional element is the one that has a smaller atomic radius than the atomic radius of the main constituent element of the precious metal film 12 and moreover, when interatomic bond energy of heterogeneous atoms between this element and the main constituent element has a value approximate to interatomic bond energy of homogeneous atoms between the main constituent elements.

This ratio D/Do drastically drops from 1 to 0.7 in a region where the difference of interatomic bond energy between the heterogeneous atoms from interatomic bond energy between the homogeneous atoms is about 20%, and the effect of restricting the grain boundary diffusion becomes remarkable.

Therefore, the grain boundary diffusion of oxygen in the precious metal film 12 can be restricted and oxidation of the electrically conductive film 11 can be limited, too, as represented by this embodiment when the element having a smaller atomic radius than that of the main constituent element of the precious metal film 12 and having interatomic bond energy between this element and the main constituent element, which is within ±20% of interatomic bond energy between the main constituent elements, is contained in the precious metal film 12.

As a result, delamination can be prevented between the electrically conductive film 11 and the precious metal film 12 and eventually, a semiconductor memory free from conduction failures and operating stably can be fabricated.

Figure 5:
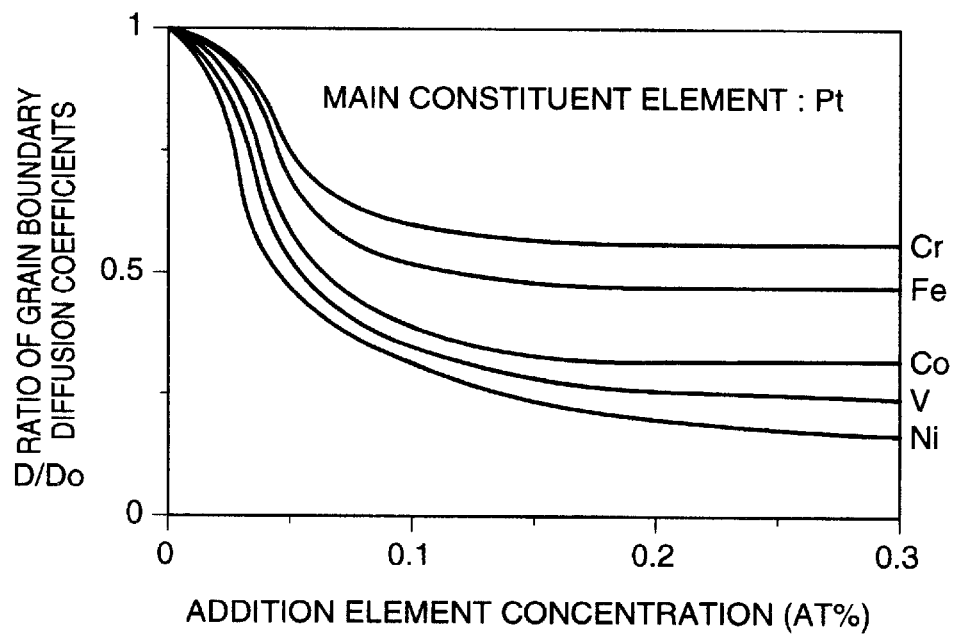
FIG. 5 is a diagram useful for explaining the influences of additional element concentrations on a ratio D/Do of a grain boundary diffusion coefficient of a film using platinum as a main constituent element.
Figure 6:
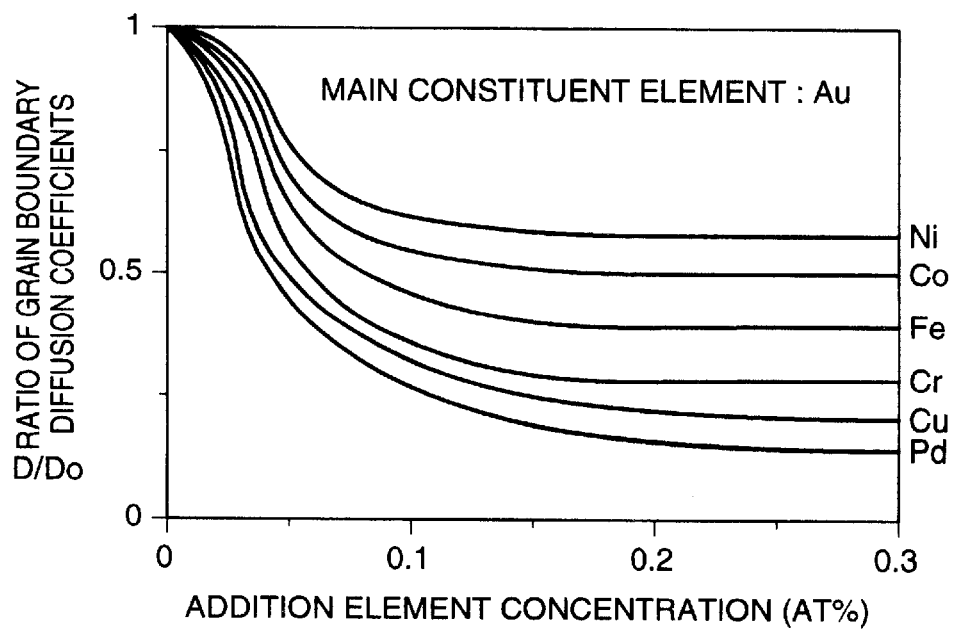
FIG. 6 is a diagram useful for explaining the influences of additional element concentrations on a ratio D/Do of a grain boundary diffusion coefficient of a film using gold as a main constituent element.
Figure 7:
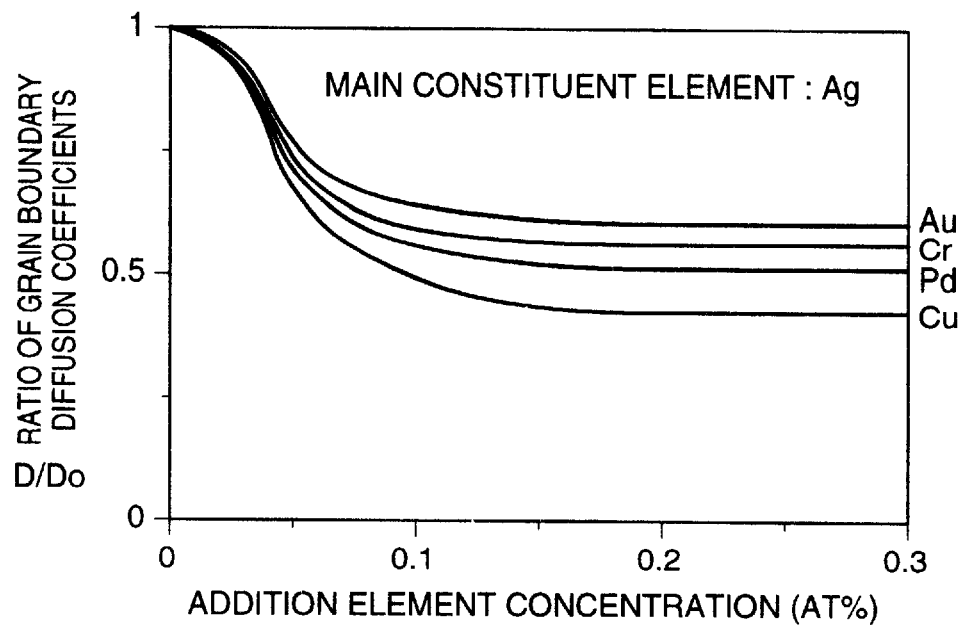
FIG. 7 is a diagram useful for explaining the influences of additional element concentrations on a ratio D/Do of a grain boundary diffusion coefficient of a film using silver as a main constituent element.

FIGS. 2, 3 and 4 show the effects when 0.2 at % of the additional elements are contained, whereas FIGS. 5, 6 and 7 show the influences of the concentrations of these additional elements on the ratio D/Do of the grain boundary diffusion coefficient when the main constituent element is platinum, gold and silver, respectively.

It can be appreciated from these drawings that the effect of restricting the grain boundary diffusion becomes remarkable when the amount of the additional elements is at least about 0.05 at %. Therefore, the effect of restricting the grain boundary diffusion can be acquired when the concentrations of the additional elements are from 0.05 at % to 50 at %.

As described above, in the first embodiment of the present invention, the element having a smaller atomic radius than that of the main constituent element of the precious metal film 12 and having interatomic bond energy between this element and the main constituent element, which is within ±20 of interatomic bond energy between the main constituent elements, is added to, or contained in, the precious metal film 12.

Consequently, the grain boundary diffusion of oxygen in the precious metal film 12 as well as oxidation of the electrically conductive film 11 can be restricted, delamination between this conductive film 11 and the precious metal film 12 can be prevented and eventually, a semiconductor memory free from conduction failures and operating stably can be fabricated.

The effect of restricting the grain boundary diffusion can be further improved by adding the additional element in the concentration of at least about 0.05 at %.

Incidentally, the first embodiment described above represents the case where the electrically conductive film 11 formed below the bottom electrode 16 of the information storage capacitance device and the silicon substrate 1 are connected through the polycrystalline silicon 10, but the material for electrically connecting the bottom electrode and the silicon substrate is not limited to the polycrystalline silicon but may be a metal thin film, a metal silicide film, an electrically conductive polymer film, a polycrystalline silicon film or their laminate structure. Further, the silicon substrate 1 and the electrically conductive film 11 may keep direct contact with each other.

Figure 8:
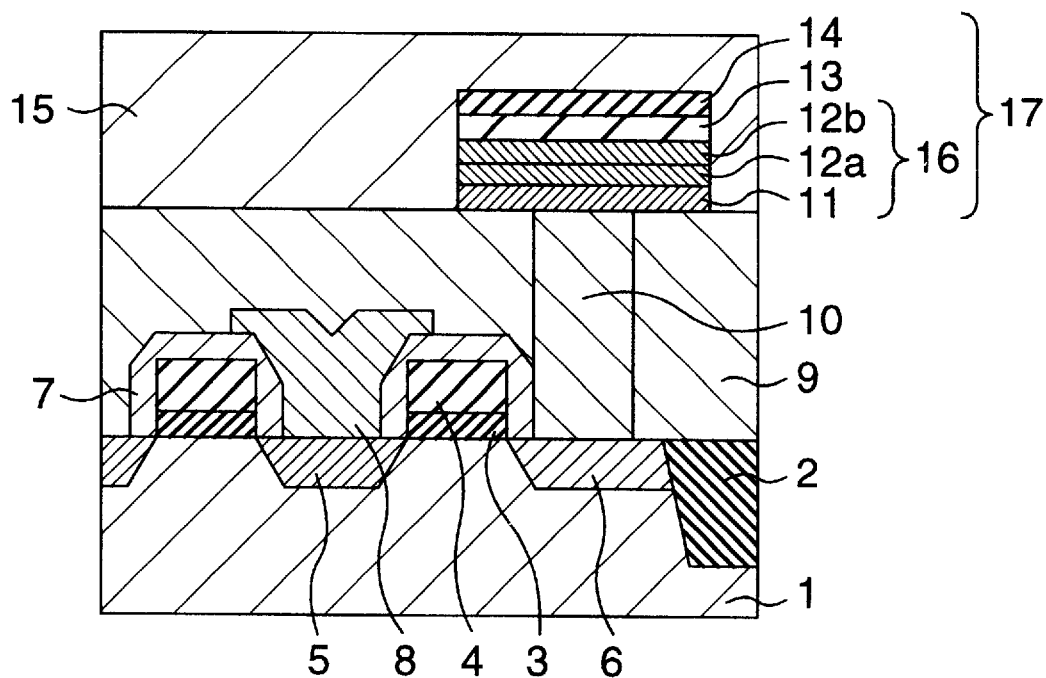
FIG. 8 is a sectional view showing the principal portions of a semiconductor memory according to the second embodiment of the present invention.

Next, FIG. 8 shows the sectional structure of the principal portions of a semiconductor memory according to the second embodiment of the present invention.

The difference of the semiconductor memory in this second embodiment from the semiconductor memory shown in FIG. 1 resides in that the bottom electrode 16 in the second embodiment shown in FIG. 8 has a laminate structure of the electrically conductive film 11 such as a TiN (titanium nitride) film or a Ti (titanium) film, a precious metal film first layer 12a and a precious metal film second layer 12b that are laminated serially from below in order named. Since the rest of the structures are the same as those of the embodiment shown in FIG. 1, their detailed description will be omitted.

Elements other than the precious metal element as the main constituent element are not added to the precious metal film first layer 12a. In contrast, the precious metal film second layer 12b contains at least one kind of additional element besides the precious metal element as the main constituent element and moreover, interatomic bond energy between this additional element and the precious metal element is within ±20% of interatomic bond energy between the precious metal elements.

More specifically, when platinum is used as the main constituent element of the precious metal film second layer 1b, at least one kind of additional elements selected from the group consisting of nickel, cobalt, vanadium and chromium may be contained. When gold is used as the main constituent element of the precious metal film second layer 12b, at least one kind of additional elements selected from the group consisting of copper, palladium, chromium, iron, cobalt and nickel may be contained.

When silver is used as the main constituent element of the precious metal film second layer 12b, at least one kind of additional elements selected from the group consisting of copper, palladium, chromium and gold may be contained. Such a precious metal film second layer 12b can be formed by two-element sputtering by using a target comprising the main constituent element and a target comprising the additional element.

The semiconductor memory according to the second embodiment of the present invention provides the following effects. Because the diffusion of oxygen in the previous metal film second layer 12b can be restricted, oxidation of the electrically conductive film 11 as well as delamination due to oxidation can be prevented even when the temperature becomes high during the formation of the oxide film 13, in the same way as in the first embodiment. Therefore, a semiconductor memory whose information storage capacitance device operates stably can be accomplished.

Because the elements other than the precious metal element as the main constituent element are not added to the precious metal film first layer 12a, the electrode resistance due to the additional element can be made smaller than that of the first embodiment.

The effect of restricting the grain boundary diffusion can be further improved by setting the additional element concentration to not lower than about 0.05 at % in the same way as in the first embodiment.

Incidentally, this second embodiment represents the case where the electrically conductive film 11 formed below the bottom electrode 16 of the information storage capacitance device 17 and the silicon substrate 1 are connected through the polycrystalline silicon 10, but the material for electrically connecting the lower electrode 16 and the silicon substrate 1 is not limited to the polycrystalline silicon and may be a metal thin film, a metal silicide film, an electrically conductive polymer film or a laminate structure of these materials inclusive of the polycrystalline silicon film. Further, the silicon substrate 1 and the electrically conductive film 11 may keep direct contact with each other.

The semiconductor memory according to the present invention is constituted as described above and provides the following effects.

In the semiconductor memory having the structure in which the information storage capacitance device comprising the precious metal film and the ferroelectric film or the oxide film having a high dielectric constant is electrically connected to the silicon substrate either directly or through the electrically conductive film, the element having a smaller atomic radius than that of the main constituent element of the precious metal and having interatomic bond energy between this element and the main constituent element, which is within ±20% of interatomic bond energy between the main constituent elements, is added to, or contained in, the precious metal film 12.

According to this construction, even when the ferroelectric film or the oxide film having a high dielectric constant is heated to a high temperature at the time of film formation, the grain boundary diffusion of oxygen in the precious metal film can be restricted, oxidation of this conductive film can be restricted, too, delamination between the conductive film and the precious metal film can be prevented and eventually, a semiconductor memory free from conduction failures and operating stably an be fabricated.

The effect of restricting the grain boundary diffusion can be further improved when the concentration of the additional element is at least about 0.05 at %.

What is claimed is:

1. A semiconductor memory having a structure in which an information storage capacitance device comprising a ferroelectric film or an oxide film having a high dielectric constant, formed on a bottom electrode including at least one layer of a precious metal layer, in such a manner as to keep contact with said bottom electrode, and a top electrode formed on said ferroelectric film or on said oxide film, is electrically connected to a silicon (Si) substrate either directly or through an electrically conductive film, wherein said precious metal layer is a single layer and includes at least one kind of additional elements, wherein said at least one kind of said additional elements is an element having a smaller atomic radius than the atomic radius of said precious metal element, and wherein an interatomic bond energy between said element and said precious metal element is within ±20% of interatomic bond energy between said precious metal elements.

2. A semiconductor memory according to claim 1, wherein said precious metal layer comprises platinum (Pt) containing at least one kind of elements selected from the group consisting of nickel (Ni), cobalt (Co), vanadium (V), iron (Fe) and chromium (Cr).

3. A semiconductor memory according to claim 1, wherein said precious metal layer comprises gold (Au) containing at least one kind of elements selected from the group consisting of copper (Cu), palladium (Pd), chromium (Cr), iron (Fe), cobalt (Co) and nickel (Ni).

4. A semiconductor memory according to claim 1, wherein said precious metal layer comprises silver (Ag) containing at least one kind of elements selected from the group consisting of copper (Cu), palladium (Pd), chromium (Cr) and gold (Au).

5. A semiconductor memory according to claim 1, wherein the concentration of said additional element to said precious metal element is from 0.05 to 50 at %.

6. A semiconductor memory having a structure in which an information storage capacitance device comprising a ferroelectric film or an oxide film having a high dielectric constant, formed on a bottom electrode including at least a first layer of a precious metal layer and a second layer of a conductive film, in such a manner as to keep contact with said bottom electrode, and a top electrode formed on said ferroelectric film or on said oxide film, is electrically connected to a silicon (Si) substrate either directly or through an electrically conductive film, wherein said precious metal layer is a single layer and includes at least one kind of additional elements, wherein said at least one kind of said additional elements is an element having a smaller atomic radius than the atomic radius of said precious metal element, and wherein an interatomic bond energy between said element and said precious metal element is within ±20% of interatomic bond energy between said precious metal elements to prevent delamination of the precious metal layer from the second layer of a conductive film by restricting grain boundary diffusion in the precious metal layer.

7. A semiconductor memory according to claim 6, wherein said precious metal layer comprises platinum (Pt) containing at least one kind of elements selected from the group consisting of nickel (Ni), cobalt (Co), vanadium (V), iron (Fe) and chromium (Cr).

8. A semiconductor memory according to claim 6, wherein said precious metal layer comprises gold (Au) containing at least one kind of elements selected from the group consisting of copper (Cu), palladium (Pd), chromium (Cr), iron (Fe), cobalt (Co) and nickel (Ni).

9. A semiconductor memory according to claim 6, wherein said precious metal layer comprises silver (Ag) containing at least one kind of elements selected from the group consisting of copper (Cu), palladium (Pd), chromium (Cr) and gold (Au).

10. A semiconductor memory according to claim 6, wherein the concentration of said additional element to said precious metal element is from 0.05 to 50 at %.

11. A semiconductor memory having a structure in which an information storage capacitance device comprising a ferroelectric film or an oxide film having a high dielectric constant, formed on a bottom electrode including at least one layer of a precious metal layer and a second layer of a conductive film, in such a manner as to keep contact with said bottom electrode, and a top electrode formed on said ferroelectric film or on said oxide film, is electrically connected to a silicon (Si) substrate either directly or through an electrically conductive film, wherein said precious metal layer is a single layer, and means for restricting grain boundary diffusion in said precious metal layer to prevent delamination of the precious metal layer from the second layer of a conductive film, said restricting means including at least one kind of additional elements being included in said precious metal layer, wherein said at least one kind of said additional elements is an element having a smaller atomic radius than the atomic radius of said precious metal element, and wherein an interatomic bond energy between said element and said precious metal element is within ±20% of interatomic bond energy between said precious metal elements.

12. A semiconductor memory according to claim 11, wherein said precious metal layer comprises platinum (Pt) containing at least one kind of elements selected from the group consisting of nickel (Ni), cobalt (Co), vanadium (V), iron (Fe) and chromium (Cr).

13. A semiconductor memory according to claim 11, wherein said precious metal layer comprises gold (Au) containing at least one kind of elements selected from the group consisting of copper (Cu), palladium (Pd), chromium (Cr), iron (Fe), cobalt (Co) and nickel (Ni).

14. A semiconductor memory according to claim 11, wherein said precious metal layer comprises silver (Ag) containing at least one kind of elements selected from the group consisting of copper (Cu), palladium (Pd), chromium (Cr) and gold (Au).

15. A semiconductor memory according to claim 11, wherein the concentration of said additional element to said precious metal element is from 0.05 to 50 at %.

* * * * *